United States Patent
Diesen

(10) Patent No.: US 10,065,714 B2
(45) Date of Patent: Sep. 4, 2018

(54) IN-SITU TESTING OF SUBSEA POWER COMPONENTS

(71) Applicant: ONESUBSEA IP UK LIMITED, London (GB)

(72) Inventor: Asbjoern Diesen, Bergen (NO)

(73) Assignee: ONESUBSEA IP UK LIMITED, London (GB)

( * ) Notice: Subject to any disclaimer, the term of this patent is extended or adjusted under 35 U.S.C. 154(b) by 231 days.

(21) Appl. No.: 14/631,623

(22) Filed: Feb. 25, 2015

(65) Prior Publication Data

US 2016/0245867 A1 Aug. 25, 2016

(51) Int. Cl.
| | |
|---|---|
| *G01R 31/34* | (2006.01) |
| *B63C 11/52* | (2006.01) |
| *G01R 31/02* | (2006.01) |
| *G01R 27/02* | (2006.01) |
| *H01R 13/523* | (2006.01) |

(52) U.S. Cl.
CPC ............ *B63C 11/52* (2013.01); *G01R 27/025* (2013.01); *G01R 31/026* (2013.01); *G01R 31/027* (2013.01); *H01R 13/523* (2013.01)

(58) Field of Classification Search
CPC .... G01R 31/34; G01R 31/343; G01R 31/346; G01R 31/06; G01R 31/02
USPC .................... 324/765.01, 545, 537
See application file for complete search history.

(56) References Cited

U.S. PATENT DOCUMENTS

| | | | |
|---|---|---|---|
| 1,923,727 A | 8/1933 | Hodnette | |
| 2,949,849 A | 8/1960 | Gundlach | |
| 3,666,992 A | 5/1972 | Goodman | |
| 3,760,314 A | 9/1973 | Krasienko et al. | |
| 4,138,699 A | 2/1979 | Ura et al. | |
| 4,789,363 A * | 12/1988 | Wicklein | F01M 11/0408 116/276 |
| 4,975,797 A | 12/1990 | Veverka et al. | |
| 5,131,464 A * | 7/1992 | Lenhart | E21B 7/04 166/65.1 |
| 5,179,489 A | 1/1993 | Oliver | |
| 5,272,442 A | 12/1993 | Schemmel et al. | |
| 5,324,886 A | 6/1994 | Nakatake et al. | |
| 5,515,230 A | 5/1996 | Ashley | |

(Continued)

FOREIGN PATENT DOCUMENTS

| | | |
|---|---|---|
| CA | 2097120 A1 | 12/1993 |
| EP | 2570585 A1 | 3/2013 |

(Continued)

OTHER PUBLICATIONS

International Search Report for International application No. PCT/EP2016/052418 dated Apr. 28, 2016.

(Continued)

*Primary Examiner* — Tung X Nguyen
*Assistant Examiner* — Dominic Hawkins
(74) *Attorney, Agent, or Firm* — Fletcher Yoder, P.C.

(57) ABSTRACT

According to some embodiments, a testing system that is configured to test subsea power components in-situ while they are deployed on the sea floor. The testing system includes a top side testing system with test instruments, a multi-conductor work-over umbilical cable, and a subsea deployable test head. The test head can be deployed using and ROV and makes electrical connection to the subsea power component via wet connects.

23 Claims, 5 Drawing Sheets

(56) References Cited

U.S. PATENT DOCUMENTS

| | | |
|---|---|---|
| 5,659,219 A | 8/1997 | Momose et al. |
| 5,699,219 A | 12/1997 | Arita et al. |
| 5,764,129 A | 6/1998 | Syouji et al. |
| 6,014,894 A * | 1/2000 | Herron ................ G01N 33/2847 184/108 |
| 6,188,552 B1 | 2/2001 | Jaeschke et al. |
| 6,580,783 B1 | 6/2003 | Swale |
| 6,595,487 B2 | 7/2003 | Johansen et al. |
| 6,626,470 B1 * | 9/2003 | Appleford ............... E21B 33/038 285/320 |
| 6,867,364 B2 | 3/2005 | Hafskjold et al. |
| 7,202,619 B1 | 4/2007 | Fisher |
| 7,301,739 B2 | 11/2007 | Hamer |
| 7,516,795 B2 * | 4/2009 | Lopes Euphemio ... E21B 43/01 166/268 |
| 7,598,751 B2 | 10/2009 | Collins, Jr. et al. |
| 7,847,189 B2 | 12/2010 | Findeisen |
| 8,108,162 B2 | 1/2012 | Matsumoto |
| 8,362,789 B2 | 1/2013 | Collins, Jr. et al. |
| 8,439,080 B2 | 5/2013 | Uusipaikka |
| 8,456,116 B2 | 6/2013 | Burdick |
| 8,549,924 B2 | 10/2013 | Virtanen et al. |
| 9,056,663 B2 | 6/2015 | Bø |
| 9,308,618 B2 * | 4/2016 | Benvegnu ............... B24B 49/10 |
| 2002/0175522 A1 | 11/2002 | Wacknov et al. |
| 2004/0065873 A1 * | 4/2004 | Peterson ................ B66D 1/485 254/276 |
| 2004/0135528 A1 | 7/2004 | Yasohara et al. |
| 2008/0144442 A1 * | 6/2008 | Combee ................... G01V 1/22 367/131 |
| 2009/0056936 A1 * | 3/2009 | McCoy, Jr. ........... E21B 19/002 166/250.01 |
| 2009/0234600 A1 | 9/2009 | Matsumoto |
| 2010/0026317 A1 | 2/2010 | Collins, Jr. et al. |
| 2010/0089126 A1 * | 4/2010 | Sweeney ................. B63C 11/42 73/40 |
| 2010/0288501 A1 | 11/2010 | Fielder et al. |
| 2011/0000677 A1 * | 1/2011 | Overfield ............ E21B 33/0355 166/336 |
| 2011/0089767 A1 | 4/2011 | Rocke et al. |
| 2011/0093216 A1 | 4/2011 | Andersson et al. |
| 2011/0140820 A1 | 6/2011 | Guentert, III et al. |
| 2011/0188392 A1 * | 8/2011 | Misumi ................. B63H 21/22 370/252 |
| 2011/0251728 A1 | 10/2011 | Batho et al. |
| 2011/0304289 A1 | 12/2011 | Burdick |
| 2011/0316659 A1 * | 12/2011 | Puchianu ............... H01F 27/245 336/210 |
| 2012/0001482 A1 | 1/2012 | Burdick |
| 2013/0033103 A1 | 2/2013 | McJunkin et al. |
| 2013/0063842 A1 | 3/2013 | Kataoka |
| 2013/0220625 A1 * | 8/2013 | Billington ............. E21B 19/002 166/336 |
| 2014/0035504 A1 * | 2/2014 | Rongve ............. G05B 23/0235 318/434 |
| 2014/0035759 A1 | 2/2014 | Ramsfjell et al. |
| 2014/0097678 A1 | 4/2014 | Thibaut et al. |
| 2014/0147243 A1 | 5/2014 | Torkildsen et al. |
| 2014/0209289 A1 | 7/2014 | Boot et al. |
| 2014/0217947 A1 | 8/2014 | Haugan |
| 2014/0347897 A1 * | 11/2014 | Broussard ................. H02J 3/36 363/35 |
| 2015/0016812 A1 | 1/2015 | Radan et al. |
| 2015/0070802 A1 | 3/2015 | Dong |
| 2015/0188297 A1 | 7/2015 | Boe et al. |
| 2015/0346266 A1 | 12/2015 | Dimino et al. |
| 2016/0181964 A1 * | 6/2016 | Nojima ................. F04D 13/086 318/503 |
| 2017/0082764 A1 * | 3/2017 | Lasante ................ G01V 1/3861 |

FOREIGN PATENT DOCUMENTS

| | | |
|---|---|---|
| EP | 2610881 A1 | 7/2013 |
| GB | 2028003 A | 2/1980 |
| WO | 2005111484 A2 | 11/2005 |
| WO | 2008055515 A1 | 5/2008 |

OTHER PUBLICATIONS

International Preliminary Report on Patentability for International application No. PCT/EP2016/052418 dated Aug. 29, 2017.

International Search Report for International application No. PCT/EP2016/052424 dated Apr. 14, 2016.

International Preliminary Report on Patentability for International application No. PCT/EP2016/052424 dated Aug. 29, 2017.

International Search Report for International application No. PCT/EP2016/052422 dated Jul. 13, 2016.

International Preliminary Report on Patentability for International application No. PCT/EP2016/052422 dated Aug. 29, 2017.

* cited by examiner

IN-SITU TESTING OF SUBSEA POWER COMPONENTS

TECHNICAL FIELD

The present disclosure relates to electrically powered subsea systems. More particularly, the present disclosure relates to systems and methods configured for in-situ testing and/or monitoring of subsea power components while on the seafloor.

BACKGROUND

In subsea environments, various fluid processing systems can be deployed. For example, in the case of seafloor-deployed fluid processing equipment for the oil and gas industry, various types of electrically powered systems are used such as subsea fluid pumps and subsea compressors. Additionally, in cases where the umbilical power supply system is relatively long, subsea step-down power transformers can be deployed on the seafloor to allow for more higher voltage energy transmission through the umbilical system. Prior to deployment of such electrically powered components (e.g. electric motors used to drive pumps or compressors and transformers) on the seafloor, each component can be tested for various electrical faults, such as insulation faults, including ground faults, as well as continuity faults. Currently, such electrical testing is performed on the surface prior to deployment of the components on the seafloor, for example on a surface vessel being used to deploy the equipment, or on land. While such surface testing of the electrical components is useful in detecting electrical faults prior to deployment, they do not detect faults that may arise during transportation through the seawater and onto the seabed, nor do they detect faults that may arise during the time the components are placed on the seabed prior to being put into operation.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

According to some embodiments, a system is described for in-situ testing of a power component in a subsea environment. The system includes: a surface subsystem which includes testing equipment configured to measure electrical characteristics of the power component from which electrical faults can be determined; a subsea subsystem configured for deployment in a subsea environment, including connectors (such as releasable wet connectors) configured to transmit electricity between the subsea test subsystem and the power component; and a cable which includes electrical conductors for transmitting electricity between the surface test subsystem and the subsea test subsystem. When the connectors are connected to the power component electrical faults can be determined based on the electrical measurements of the power component by surface test subsystem.

According to some embodiments, the subsea subsystem also includes a negatively buoyant subsea test head on which the connectors are mounted. The test head can be configured for deployment in the subsea environment using a remotely operated underwater vehicle (ROV). The power component can be configured for continuous deployment in the subsea environment for at least five years.

According to some embodiments, the power component is a subsea motor that can be used to drive a subsea device such as a subsea pump, a subsea compressor, or a subsea separator. The power component can be powered by three-phase electric power, the subsea subsystem can include at least three connectors (such as releasable wet connectors), and the cable can include at least three electrical conductors. The power component can form part of a fluid processing system that is configured to process hydrocarbon bearing fluids produced from a subterranean rock formation. According to some other embodiments, the power component is not an electric motor but rather some other type of subsea power component. Examples include a subsea transformer, a subsea variable frequency drive (VFD) and subsea switchboard. According to some embodiments the connector can be a single connector with multiple electrical connection elements such as pins, or pin-receptacles arranged in a male, female, or combinations of male/female elements. According to some embodiments, the connector or connectors are a stab-type connector(s).

The cable can be a suspension cable configured to suspend a negatively buoyant subsea test head on which the connectors are mounted. According to some other embodiments, the cable can be an umbilical cable used to deploy a remotely operated underwater vehicle (ROV) that in turn is used to deploy a negatively buoyant subsea test head on which the connectors are mounted.

According to some embodiments, a method is described for in-situ testing of a power component in a subsea environment. The method includes: deploying a surface subsystem to a surface location; deploying a subsea subsystem to the power component which is deployed at a subsea location, the subsea subsystem being in electrical communication with the surface subsystem at least in part through a cable including electrical conductors; making electrical connection between the subsea subsystem and the power component using connectors (such as releasable wet connectors); and measuring with the surface subsystem electrical characteristics of the power component from which electrical faults can be determined. According to some embodiments, after the measuring, the method can further include: disconnecting the connectors from the power component; and operating the power component.

According to some embodiments, one or more of the described systems and/or methods can be used in topside or subsea fluid processing equipment in an analogous fashion.

According to some embodiments, a subsea system is described for in-situ testing of a power component in a subsea environment. The system includes: a housing configured for deployment in a subsea environment; testing equipment configured to measure one or more electrical characteristics of the power component from which one or more electrical faults can be determined; and one or more connectors configured to transmit electricity between the testing equipment and the power component, wherein when the connectors are connected to the power component the one or more electrical faults can be determined based on the one or more electrical measurements of the power component by testing equipment.

BRIEF DESCRIPTION OF THE DRAWINGS

The subject disclosure is further described in the detailed description which follows, in reference to the noted plurality of drawings by way of non-limiting examples of embodiments of the subject disclosure, in which like reference numerals represent similar parts throughout the several views of the drawings, and wherein.

DETAILED DESCRIPTION

The particulars shown herein are by way of example, and for purposes of illustrative discussion of the embodiments of the subject disclosure only and are presented in the cause of providing what is believed to be the most useful and readily understood description of the principles and conceptual aspects of the subject disclosure. In this regard, no attempt is made to show structural details of the subject disclosure in more detail than is necessary for the fundamental understanding of the subject disclosure, the description taken with the drawings making apparent to those skilled in the art how the several forms of the subject disclosure may be embodied in practice. Further, like reference numbers and designations in the various drawings indicate like elements.

According to some embodiments, techniques are described that avoid drawbacks associated with surface-only testing of subsea power components such as subsea transformers and subsea electric motors. A testing system that is configured to test subsea power components in-situ while they are deployed on the sea floor is described. Unlike surface-only testing, such subsea in-situ testing is able to detect faults that may arise during transportation though the seawater and onto the seabed, as well as during the time the components are placed on the seabed prior to being put into operation.

Figure 1:
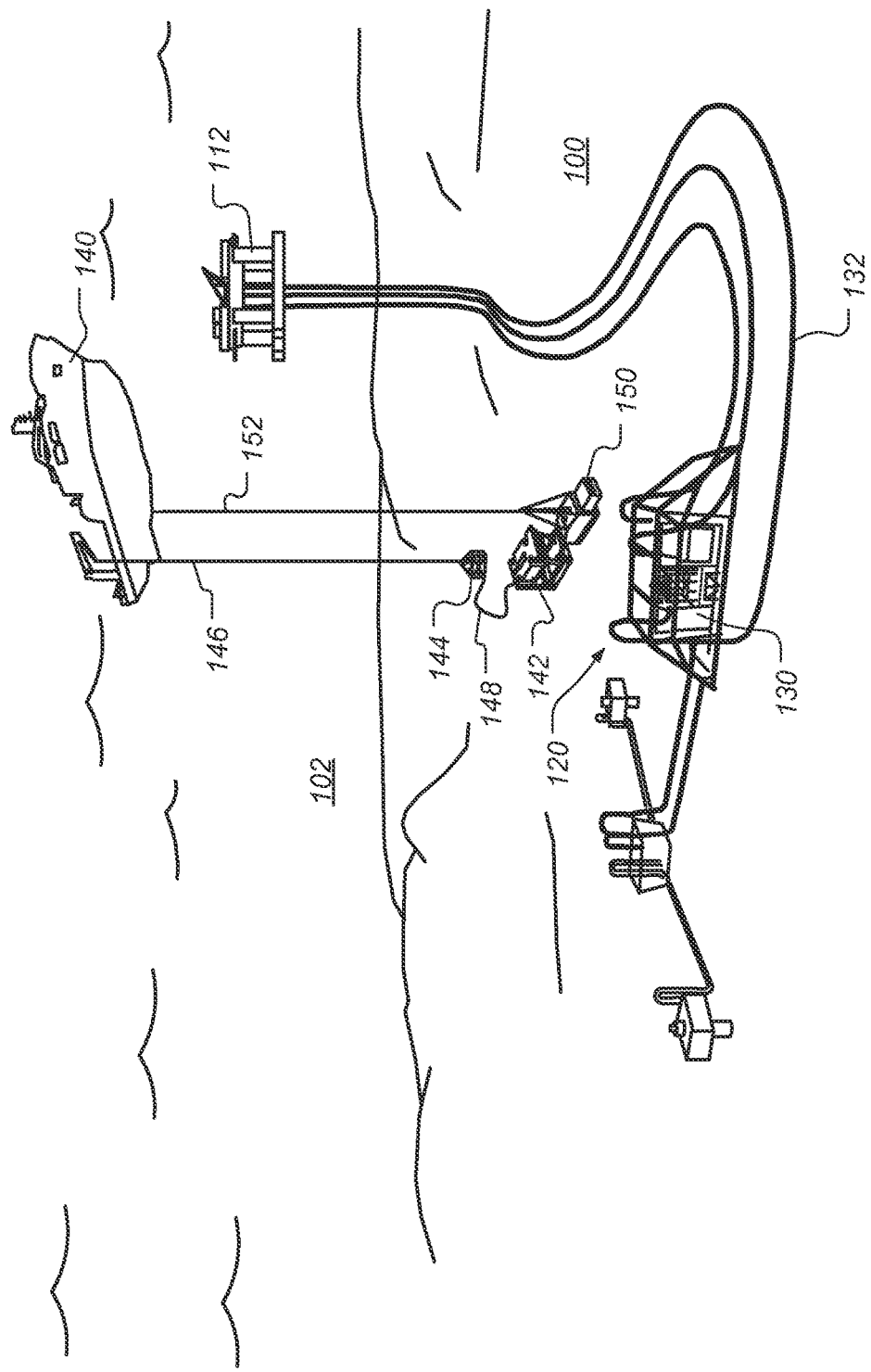
FIG. 1 is a diagram illustrating a subsea environment in which a subsea power component testing system is deployed, according to some embodiments.

FIG. 1 is a diagram illustrating a subsea environment in which a subsea power component testing system is deployed, according to some embodiments. On sea floor 100 a station 120 is shown which is downstream of several wellheads being used, for example, to produce hydrocarbon-bearing fluid from a subterranean rock formation. Station 120 includes a subsea pump 130. The station 120 is connected to one or more umbilical cables, such as umbilical 132. The umbilicals in this case are being run from a platform 112 through seawater 102, along sea floor 100 and to station 120. In other cases, the umbilicals may be run from some other surface facility such as a floating production, storage and offloading unit (FPSO), or a shore-based facility. In addition to pump 130, the station 120 can include various other types of subsea equipment, including other power components such as other pumps and/or compressors, and one or more subsea step-down transformers. Subsea step-down transformers can be used, for example, where it is desirable to supply high-voltage power through the umbilical 132. The umbilical 132 can also be used to supply barrier and other fluids, and control and data lines for use with the subsea equipment in station 120.

Also visible in FIG. 1 is ROV 142, tethered using main lift umbilical 146 and tether management system 144 and tether cable 148. According to some embodiments, ROV 142 is being used to deploy test head 150 that is configured to make electrical connection with and facilitate testing of one or more power components, such as transformers and/or motors used to drive pumps and/or compressors in station 120. The test head 150 is deployed using umbilical cable 152 from surface vessel 140, which is also being used to deploy ROV 142.

Figure 2:
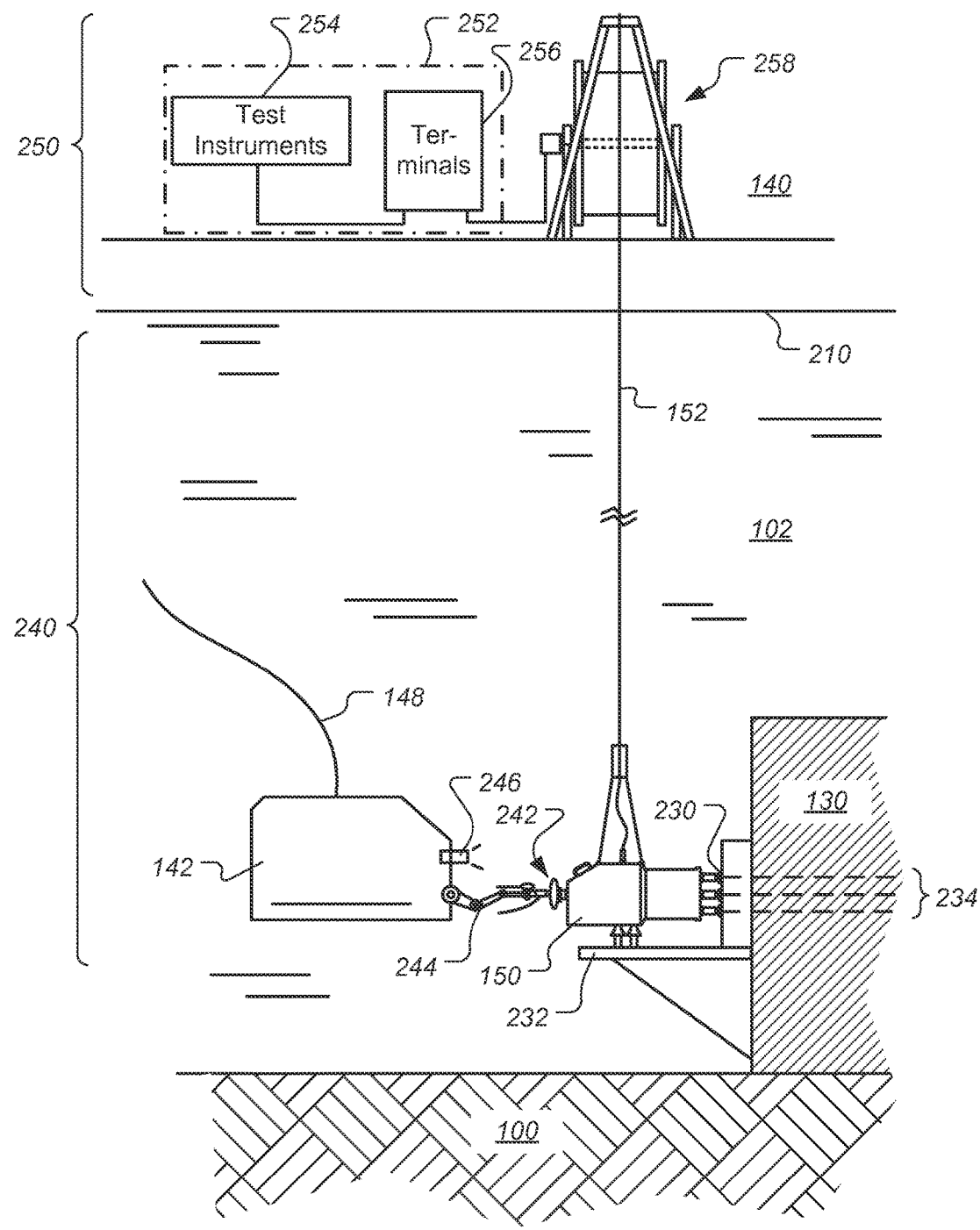
FIG. 2 is a diagram illustrating some aspects of a subsea power component testing system, according to some embodiments.

FIG. 2 is a diagram illustrating some aspects of a subsea power component testing system, according to some embodiments. Above the sea surface 210, the power component testing system includes a topside system 250 that in this example resides within vessel 140. The topside system 250 includes a testing container 252 that houses power test instruments 254 and terminals 256. The umbilical cable 152 is handled by cable handling system 258. The test instruments are configured to carry out the electrical tests, for example isolation resistance testing, high voltage testing and continuity testing. According to some embodiments, the umbilical cable 152 simply contains three high-voltage high-current conductors such that the test instruments 258 can be similar or identical to known test instruments used in similar tests in a surface environment. Below surface 210 is the subsea system 240 that includes a portion of umbilical cable 152 as well as test head 150. Subsea test head 150 is shown being deployed on electrical power component 130 which can be, for example, an electric motor used to drive a subsea compressor or pump, or a subsea transformer. Test head 150 is preferably negatively buoyant and is shown being deployed using ROV 142 that includes an ROV manipulator arm 244 that can include a tool and/or TV 242. ROV 142 also includes a light 246. ROV 142 is shown positioning test head 150 on ledge 232 of component 130 such that connectors on head 150 are aligned with connectors 230 on component 130. According to some embodiments, the cable 152 is a simple deployment cable without electrical conductors, and the power connection with component 130 through test head 150 is provided instead through ROV 142, ROV tether cable 148 and mail lift umbilical 146 to vessel 140 (and to terminals 256).

Figure 3A:
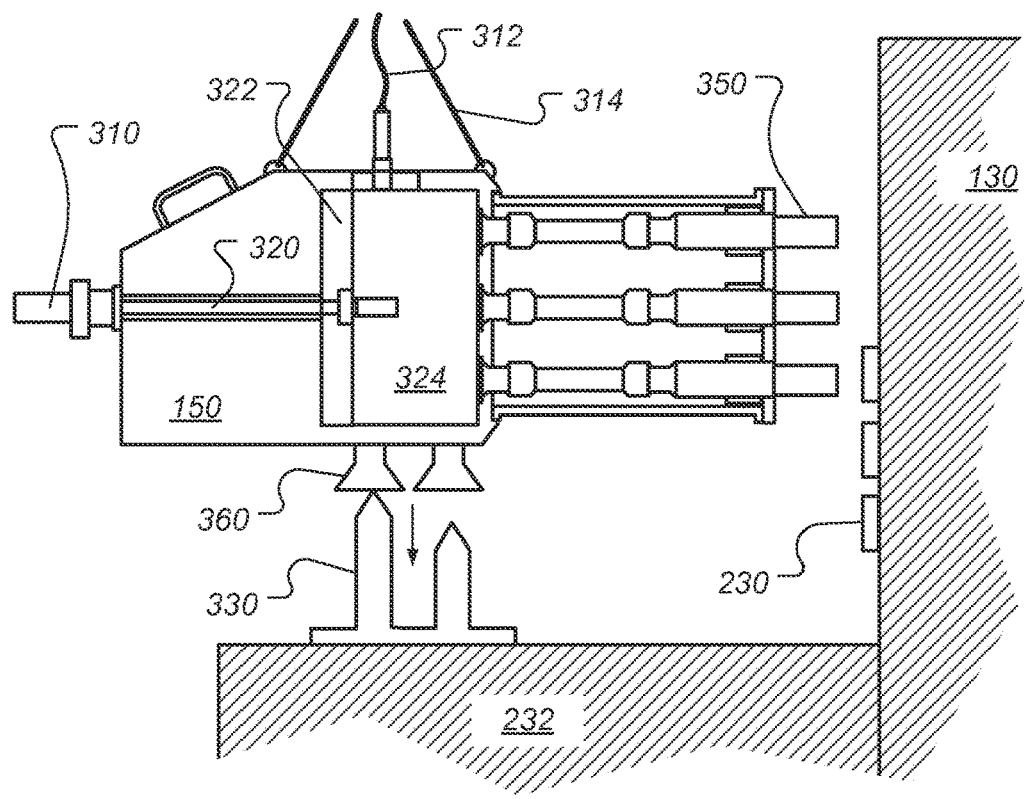
FIGS. 3A and 3B are diagrams illustrating further aspects of a test head used for subsea power component testing, according to some embodiments.
Figure 3B:
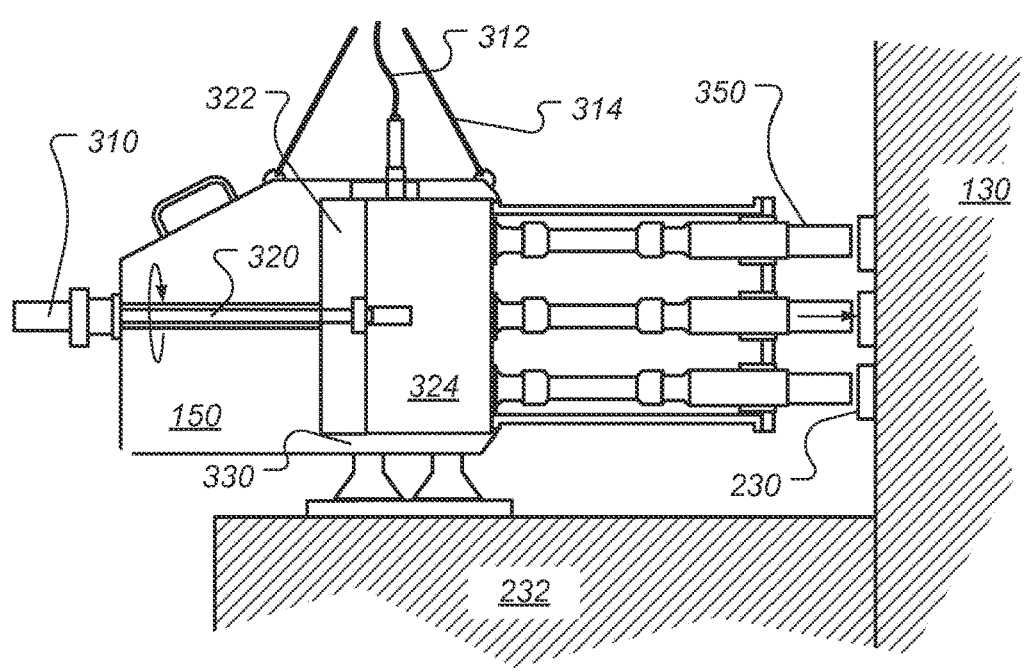

FIGS. 3A and 3B are diagrams illustrating further aspects of a test head used for subsea power component testing, according to some embodiments. In FIG. 3A, test head 150 is shown being positioned above shelf 232 on component 130 such that docking cones 360 on head 150 are aligned with guideposts 330 on shelf 232. The test head 150 is lowered down on the shelf 232 with ROV 142 (not shown) and suspension cables 314. In FIG. 3B, test head 150 is shown fully lowered on the shelf 232. The wet make-break (i.e. connectable and releasable) electrical connectors 350 are urged to mate with connectors 230 on component 130, for example, using a leadscrew mechanism that includes a spindle 320 that is driven by an ROV using a standard ROV operated spindle handle 310. The lead screw mechanism pushes terminal box 324 and compliant mount wet connectors 350 to mate with connectors 230 on component 130. According to other embodiments another type of connector or connectors are used. For example, according to some embodiments, a direct electric submersible pump (ESP) ROV stab-type connector is used. According to some embodiments a single connector is used that includes three pins for making three separate electrical connections between test head 150 and component 130. According to other embodiments, other arrangements and/or combinations of connector elements (e.g. male vs. female mating surfaces, pins, plugs, blades, sockets, etc.). According to some embodiments the number of connectors is one, two, three or more connectors depending on the application and the type of connectors used. According to some embodiments, other structures are used for positioning and/or aligning the connectors than the docking cones and guidepost arrangement shown in FIGS. 3A and 3B.

Figure 4:
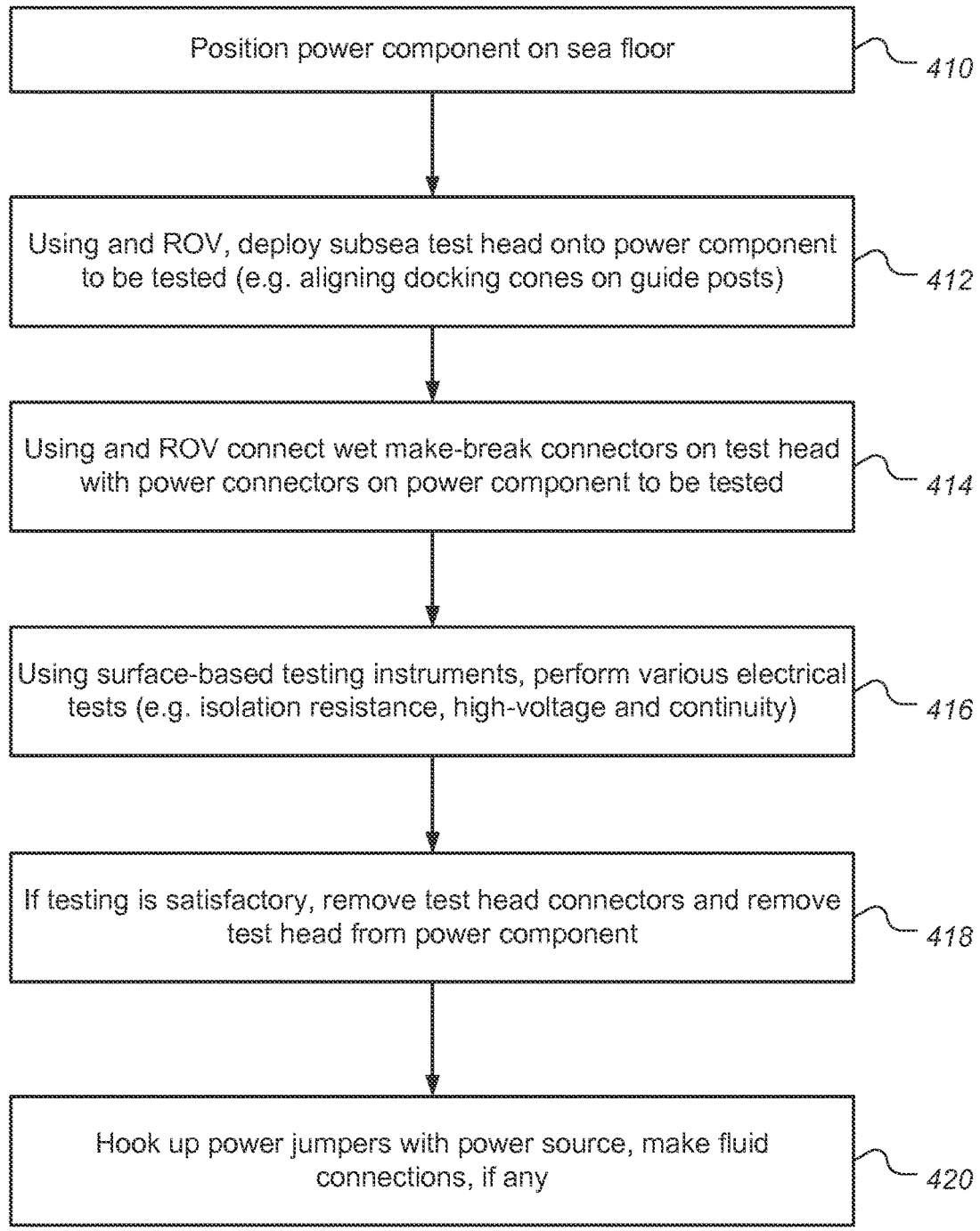
FIG. 4 is a flow chart illustrating some aspects of in-situ testing of subsea power components, according to some embodiments.

FIG. 4 is a flow chart illustrating some aspects of in-situ testing of subsea power components, according to some embodiments. In block 410 the subsea power component, for example, a pump or compressor module with an integrated electric drive motor or a subsea transformer, is positioned on the sea floor. Some time after the subsea component is positioned on the sea floor and before it is put into operation, the in-situ testing is carried out. In block 412, the subsea test head, such as head 150 shown in FIGS. 1, 2 and 3, is positioned onto the subsea component. The test head is preferably negatively buoyant and is placed using an ROV. According to some embodiments, docking cones and guideposts are used to align the test head in a suitable position with respect to the power component. In block 414, the test head wet-connect is mated with the power connectors on the power component. In the case of three-phase power, each of three power connectors from the test head is mated with the appropriate supply power connector on the power component being tested. According to some embodiments, the ROV is used to make the connections. In some examples, the ROV turns a spindle that actuates a leadscrew that pushes the make-break connectors forward. In block 416, the surface-based testing instruments perform various electrical tests on the power component, using conductors running between the surface equipment and the subsea test head. According to some embodiments, the tests performed include high voltage (e.g. 5 KV) insulation resistance testing (e.g. using a megohmmeter) to detect insulation failures (e.g. ground faults), and continuity tests to detect broken conductors. In block 418, if testing is satisfactory, the test head connectors are removed from the power component and the test head is lifted away, for example using an ROV. According to some embodiments, further power components can be tested by the same test head. For example, if there are other motors and/or transformers on the same subsea station, the ROV can relocate the test head for testing of such components. In block 420, the power jumpers for the tested power component are connected. For example, in the case of subsea transformer or subsea motor the power supply, jumpers from an umbilical termination head, or from a transformer are connected. Fluid connections can also be made, if necessary prior to placing the tested power component into operation.

Figure 5:
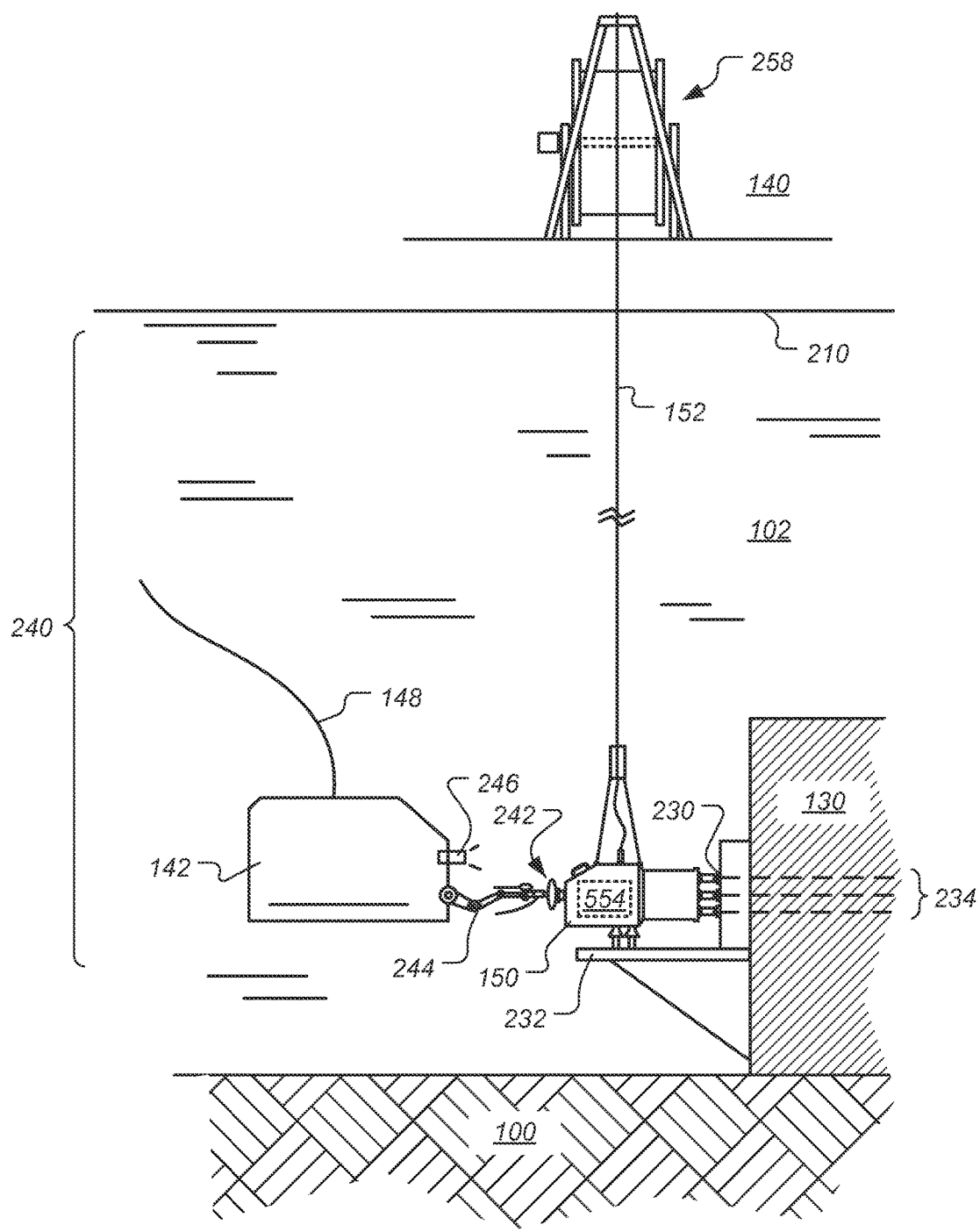
FIG. 5 is a diagram illustrating some aspects of an integrated subsea power component testing system, according to some embodiments.

FIG. 5 is a diagram illustrating some aspects of an integrated subsea power component testing system, according to some embodiments. In this case, test instruments 554 are included in the test head 150 instead of being located on the surface (e.g. instruments 254 in FIG. 2). The test instruments 554 are configured to carry out the electrical tests, for example isolation resistance testing, high voltage testing and continuity testing. According to some embodiments, the testing is remotely controlled via the ROV 142 communicating via its surface link through tether cable 148, or via control signals carried within cable 152. According to some other embodiments, a hybrid system is used wherein some testing instruments 554 integrated in head 150 are combined with some surface testing instruments 245 (as shown in FIG. 2) are used to carry out the electrical tests of subsea power component 130.

While the techniques for in-situ testing of subsea power components have thus far been described in the context of testing prior to operation. According to some embodiments, the test head and other testing system components can be used for testing of such power components during their lifetime installed on the seafloor without having to retrieve the power components to the surface.

While the techniques for in-situ testing of subsea power components have thus far been described in the context of testing power components such as three-phase transformers and/or subsea motors for driving pumps and compressors, other types of power components can be tested. Examples of other types of power components include subsea variable frequency drives (VFDs) and subsea switchboards. According to some embodiments, two-phase, single phase electrically power subsea components can also be tested in-situ in the subsea environment using the techniques described herein.

While the subject disclosure is described through the above embodiments, it will be understood by those of ordinary skill in the art that modification to and variation of the illustrated embodiments may be made without departing from the inventive concepts herein disclosed. Moreover, while some embodiments are described in connection with various illustrative structures, one skilled in the art will recognize that the system may be embodied using a variety of specific structures. Accordingly, the subject disclosure should not be viewed as limited except by the scope and spirit of the appended claims.

What is claimed is:

1. A system for in-situ testing of a power component in a subsea environment, the system comprising:
a surface subsystem including testing equipment configured to measure one or more electrical characteristics of the power component from which one or more electrical faults are determined;
a subsea subsystem configured to enable the testing equipment to measure the one or more electrical characteristics of the power component when the power component is in a subsea environment prior to a subsea device being driven by the power component, wherein the subsea subsystem is configured to be deployed in the subsea environment, wherein the subsea subsystem comprises one or more connectors configured to transmit electricity between the subsea subsystem and the power component;
a cable including one or more electrical conductors for transmitting electricity between the surface test subsystem and the subsea subsystem, wherein the one or more electrical faults are determined based on the one or more electrical measurements of the power component by the surface test subsystem when the one or more connectors are connected to the power component, wherein the one or more electrical faults arose during deployment of the power component through the subsea environment; and
a remotely operated underwater vehicle (ROV) configured to deploy the subsea subsystem in the subsea environment and connect the one or more connectors of the subsea subsystem to the power component.

2. The system according to claim 1, wherein the one or more connectors comprise one or more releasable wet connectors.

3. The system according to claim 1, wherein the subsea subsystem further includes a negatively buoyant subsea test head on which the one or more connectors are mounted.

4. The system according to claim 1, wherein the power component is a subsea motor or a subsea transformer.

5. The system according to claim 4, wherein the subsea device is selected from a group consisting of: a subsea pump, a subsea compressor, and a subsea separator.

6. The system according to claim 1, wherein the power component is of a type selected from a group consisting of: subsea variable frequency drive (VFD) and subsea switchboard.

7. The system according to claim 1, wherein the cable is a suspension cable configured to suspend a negatively buoyant subsea test head on which the one or more connectors are mounted.

8. The system according to claim 1, wherein the cable is further configured as an umbilical cable used to deploy the remotely operated underwater vehicle (ROV) which in turn is used to deploy a negatively buoyant subsea test head on which the one or more connectors are mounted.

9. The system according to claim 1, wherein the power component is powered by three-phase electric power, and the subsea subsystem includes at least three releasable wet connectors and the cable includes at least three electrical conductors.

10. The system according to claim 1, wherein the power component is powered by three-phase electric power, and the subsea subsystem includes a releasable wet connector having at least three connector pins and the cable includes at least three electrical conductors.

11. The system according to claim 1, wherein the power component forms part of a fluid processing system configured to process hydrocarbon bearing fluids produced from a subterranean rock formation.

12. The system according to claim 1, wherein the one or more connectors comprise one or more stab connectors.

13. The system according to claim 1, wherein the ROV is configured to connect the one or more connectors of the subsea subsystem to the power component by turning a spindle of the subsea subsystem that actuates a lead screw of the subsea subsystem to push the one or more connectors to connect to the power component.

14. The system according to claim 1, wherein the ROV is configured to turn a spindle of the power component and to actuate a leadscrew, wherein turning the spindle and actuating the leadscrew pushes the one or more connectors forward to determine the additional electrical faults.

15. The system according to claim 1, wherein the one or more electrical faults that arose during deployment of the power component through the subsea environment are based on performing high voltage insulation resistance testing.

16. The system according to claim 1, wherein the one or more electrical faults that arose during deployment of the power component through the subsea environment are based on performing continuity tests configured to detect broken conductors.

17. A method for in-situ testing of a power component in a subsea environment, the method comprising:
deploying a surface subsystem to a surface location;
deploying a remotely operated underwater vehicle (ROV) at a subsea location;
deploying a subsea subsystem via the ROV to the power component which is deployed at the subsea location, the subsea subsystem being in electrical communication with the surface subsystem at least in part through a cable including one or more electrical conductors;
using the ROV to make one or more electrical connections between the subsea subsystem and the power component using one or more connectors; and
measuring with the surface subsystem one or more electrical characteristics of the power component from which one or more electrical faults that arose during transportation of the power component through the subsea environment are determined via the one or more electrical connections prior to a subsea device being driven by the power component.

18. The method according to claim 17, wherein the one or more connectors comprise one or more releasable wet connectors.

19. The method according to claim 17, wherein the subsea subsystem is a negatively buoyant subsea test head on which the one or more connectors are mounted.

20. The method according to claim 19, wherein the cable comprises a suspension cable configured to suspend the test head.

21. The method according to claim 17, further comprising, after the measuring:
disconnecting the one or more connectors from the power component; and
operating the power component.

22. A subsea system for in-situ testing of a power component deployed in a subsea environment, the system comprising:
a housing configured for deployment in a subsea environment;
testing equipment configured to measure one or more electrical characteristics of the power component from which one or more electrical faults that arose during deployment of the power component and the housing through the subsea environment are determined prior to a subsea device being driven by the power component;
one or more connectors configured to transmit electricity between the testing equipment and the power component, wherein when the one or more connectors are connected to the power component the one or more electrical faults are determined based on the one or more electrical measurements of the power component by testing equipment; and
a remotely operated underwater vehicle (ROV) configured to deploy the subsea system in the subsea environment and connect the one or more connectors to the power component.

23. The system according to claim 22, wherein the power component is of a type selected from a group consisting of: subsea motor, subsea transformer, subsea variable frequency drive (VFD) and subsea switchboard.

* * * * *